US011275200B2

(12) United States Patent
Wang et al.

(10) Patent No.: US 11,275,200 B2
(45) Date of Patent: Mar. 15, 2022

(54) ARRAY SUBSTRATE AND MANUFACTURING METHOD THEREOF, DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Shoukun Wang, Beijing (CN); Huibin Guo, Beijing (CN); Hao Han, Beijing (CN); Fangbin Fu, Beijing (CN); Yihe Jia, Beijing (CN); Yongzhi Song, Beijing (CN); Zhichang Liu, Beijing (CN); Jiantao Liu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 71 days.

(21) Appl. No.: 16/632,030

(22) PCT Filed: Jul. 24, 2019

(86) PCT No.: PCT/CN2019/097495
§ 371 (c)(1),
(2) Date: Jan. 17, 2020

(87) PCT Pub. No.: WO2020/020224
PCT Pub. Date: Jan. 30, 2020

(65) Prior Publication Data
US 2021/0223440 A1 Jul. 22, 2021

(30) Foreign Application Priority Data
Jul. 24, 2018 (CN) .......................... 201810821680.1

(51) Int. Cl.
G02B 1/115 (2015.01)
G02F 1/1335 (2006.01)
(Continued)

(52) U.S. Cl.
CPC ............ *G02B 1/115* (2013.01); *G02F 1/1368* (2013.01); *G02F 1/13439* (2013.01);
(Continued)

(58) Field of Classification Search
CPC ............... G02B 1/115; G02F 1/133502; G02F 1/133512; G02F 1/134309; G02F 1/13439
(Continued)

(56) References Cited

U.S. PATENT DOCUMENTS 6,716,323 B1 * 4/2004 Siddle .................... C03C 17/09
204/192.12
9,000,665 B2    4/2015 Yoo et al.
(Continued)

FOREIGN PATENT DOCUMENTS

CN          1553527 A     12/2004
CN        103197361 A      7/2013
(Continued)

OTHER PUBLICATIONS

Office Action for corresponding Chinese Application No. 201810821680.1 and English translation, dated Aug. 20, 2021. 47 pages.

*Primary Examiner* — Christopher M Raabe
(74) *Attorney, Agent, or Firm* — Leason Ellis LLP

(57) ABSTRACT

An array substrate and a manufacturing method thereof, a display panel and a display device are disclosed. The array substrate includes a transparent base substrate and an electrode structure provided on the transparent base substrate, the electrode structure including an anti-reflective layer and a first electrode layer, the anti-reflective layer being located between the first electrode layer and the transparent base substrate.

14 Claims, 7 Drawing Sheets

(51) Int. Cl.
  *G02F 1/1343* (2006.01)
  *G02F 1/1362* (2006.01)
  *G02F 1/1368* (2006.01)
  *H01L 27/32* (2006.01)
  *H01L 51/52* (2006.01)
  *H01L 51/56* (2006.01)

(52) U.S. Cl.
  CPC .. *G02F 1/133502* (2013.01); *G02F 1/133512* (2013.01); *G02F 1/134309* (2013.01); *G02F 1/136209* (2013.01); *H01L 27/3276* (2013.01); *H01L 51/5281* (2013.01); *H01L 51/56* (2013.01); *H01L 2227/323* (2013.01)

(58) Field of Classification Search
  USPC ....................................................... 362/97.1
  See application file for complete search history.

(56) References Cited

U.S. PATENT DOCUMENTS

| | | | |
|---|---|---|---|
| 9,048,459 B2 | 6/2015 | Cho et al. | |
| 9,324,972 B2 | 4/2016 | Yang et al. | |
| 10,103,210 B2 | 10/2018 | Kim et al. | |
| 10,884,304 B2 | 1/2021 | Jian et al. | |
| 2008/0042136 A1* | 2/2008 | Lee | H01L 51/5284 257/72 |
| 2009/0079921 A1* | 3/2009 | Mori | G02F 1/133555 349/114 |
| 2011/0018079 A1 | 1/2011 | Pain et al. | |
| 2013/0177751 A1 | 7/2013 | Oh et al. | |
| 2013/0249383 A1* | 9/2013 | Yoo | H05B 33/22 313/504 |
| 2015/0280154 A1 | 10/2015 | Jang et al. | |
| 2016/0068703 A1* | 3/2016 | Schmidt | B05D 5/063 428/520 |
| 2017/0235196 A1 | 8/2017 | Lai et al. | |

FOREIGN PATENT DOCUMENTS

| | | |
|---|---|---|
| CN | 103325811 A | 9/2013 |
| CN | 103367388 A | 10/2013 |
| CN | 103794734 A | 5/2014 |
| CN | 104659056 A | 5/2015 |
| CN | 106653797 A | 5/2017 |
| CN | 107797332 A | 3/2018 |
| CN | 108281432 A | 7/2018 |
| KR | 1020180002947 A | 1/2018 |

* cited by examiner

10

ARRAY SUBSTRATE AND MANUFACTURING METHOD THEREOF, DISPLAY PANEL AND DISPLAY DEVICE

CROSS-REFERENCE TO RELATED APPLICATIONS

This application is a U.S. National Stage Application under 35 U.S.C. § 371 of International Patent Application No. PCT/CN2019/097495, filed Jul. 24, 2019, which claims priority to Chinese Patent Application No. 201810821680.1 entitled "Array Substrate and Manufacturing method thereof, and Display Panel" and filed on Jul. 24, 2018, the disclosure of which is incorporated herein by reference in its entirety as part of the present application.

TECHNICAL FIELD

Embodiments of the present disclosure provide an array substrate and a manufacturing method thereof, a display panel and a display device.

According to first aspect of the present disclosure, it is provided an array substrate, comprising:
a transparent base substrate; and
an electrode structure, provided on the transparent base substrate, the electrode structure comprising:
a first electrode layer; and
An anti-reflective layer, the anti-reflective layer being located between the first electrode layer and the transparent base substrate.

According to second aspect of the present disclosure, it is provided a display panel comprising the afore-mentioned array substrate.

According to third aspect of the present disclosure, it is provided a display device comprising the afore-mentioned display panel.

According to fourth aspect of the present disclosure, it is provided a manufacturing method of an array substrate, comprising:
providing a transparent base substrate;
forming an anti-reflective layer and a first electrode layer on the transparent base substrate to obtain an electrode structure,
Wherein the anti-reflective layer is formed between the first electrode layer and the transparent base substrate.

BACKGROUND

With development and progress of the society, electronic display products are applied more and more widely, and users also demand higher and higher on a display effect of the electronic display products. However, in an actual application process of a current electronic display product, a component such as an electrode in the electronic display product will reflect light incident from outside; and since different components are located in different positions in the electronic display product, the reflected light of the electronic display product is unevenly distributed, which adversely affects contrast of a display image and reduces a display effect of the electronic display product.

SUMMARY

Embodiments of the present disclosure provide an array substrate and a manufacturing method thereof, a display panel and a display device.

According to first aspect of the present disclosure, it is provided an array substrate, comprising:
a transparent base substrate; and
an electrode structure, provided on the transparent base substrate, the electrode structure comprising:
a first electrode layer; and
an anti-reflective layer, the anti-reflective layer being located between the first electrode layer and the transparent base substrate.

According to second aspect of the present disclosure, it is provided a display panel comprising afore-mentioned array substrate.

According to third aspect of the present disclosure, it is provided a display device comprising afore-mentioned display panel.

According to fourth aspect of the present disclosure, it is provided a manufacturing method of an array substrate, comprising:
providing a transparent base substrate;
forming an anti-reflective layer and a first electrode layer on the transparent base substrate to obtain an electrode structure,
wherein the anti-reflective layer is formed between the first electrode layer and the transparent base substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
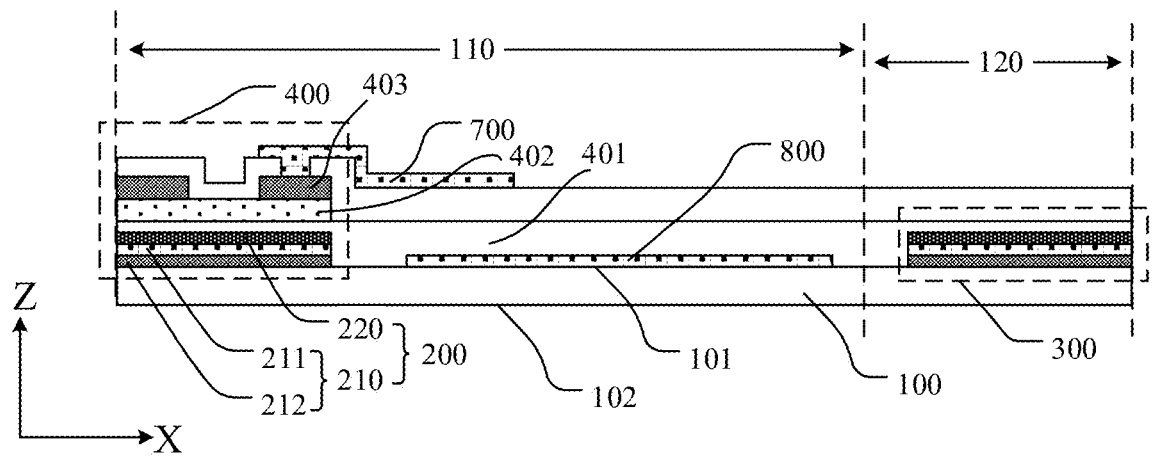
FIG. 1 is a cross-sectional view of a partial structure of an array substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least one embodiment of the present disclosure provides an array substrate, comprising a transparent base substrate; and an electrode structure provided on the transparent base substrate, the electrode structure including: a first electrode layer; and an anti-reflective layer, the anti-reflective layer being located between the first electrode layer and the transparent base substrate.

In the embodiment of the present disclosure, the anti-reflective layer in the electrode structure can reduce reflection of light incident from the base substrate, so that the electrode structure can reduce reflection of light or does not reflect light. As a result, reflection of light by the array substrate can be reduced when the array substrate is placed on a display side of a display panel, and contrast of the array substrate or contrast of a display image of the display panel comprising the array substrate is increased, thus, a display effect is increased. For example, the array substrate is a thin film transistor (TFT) array substrate used in a liquid crystal display device, or an organic light emitting diode (OLED) substrate used in an OLED display device.

For example, the transparent base substrate includes a first main surface and a second main surface. The anti-reflective layer and the electrode structure are stacked on the first main surface; and the anti-reflective layer is configured to reduce the electrode structure's reflection of light incident from the second main surface of the transparent base substrate onto the electrode structure. For example, the second main surface is located on the display side of the display panel, and light from the display side is incident onto the second main surface. In the embodiment of the present disclosure, the anti-reflective layer in the electrode structure can reduce reflection of light incident from the second main surface of the base substrate, so that the electrode structure reduces light reflection or does not reflect light, which, thus, can reduce the array substrate's reflection of light while the array substrate is placed on the display side of the display panel.

Hereinafter, an array substrate and a manufacturing method thereof, a display panel and a display device according to at least one embodiment of the present disclosure will be described in conjunction with the accompanying drawings.

FIG. 1 is a cross-sectional view of a partial structure of an array substrate provided by an embodiment of the present disclosure.

In at least one embodiment of the present disclosure, as illustrated in FIG. 1, an array substrate 10 comprises a transparent base substrate 100 and an electrode structure 200, the base substrate 100 including a first main surface 101 and a second main surface 102 opposite to the first main surface 101, the electrode structure 200 being provided on the first main surface 101, the electrode structure 200 including an anti-reflective layer 210 and a first electrode layer 220 that are stacked. The anti-reflective layer 210 is located between the first electrode layer 220 and the base substrate 100; and the anti-reflective layer 210 reduces reflection of the electrode structure 200 with respect to light incident from the second main surface 102 of the base substrate 100 onto the electrode structure 200.

In at least one embodiment of the present disclosure, a material of a first electrode layer will not be limited. For example, the material of the first electrode layer may include metals such as copper, aluminum, molybdenum, chromium, and alloys thereof.

Hereinafter, technical solutions in at least one of following embodiments of the present disclosure will be described by using copper metal film or aluminum metal film having certain light reflectivity as the first electrode layer. In a case where the first electrode layer 220 has certain light reflectivity, the anti-reflective layer 210 can reduce reflection of the first electrode layer 220 with respect to light incident from the second main surface 102 of the base substrate 100 onto the first electrode layer 220. It should be noted that, light reflectivity of a metal such as copper and aluminum is related to a thickness, so the light reflectivity of the first electrode layer may be determined according to a material and a thickness. For example, in at least one embodiment of the present disclosure, a thickness of a first electrode layer may be from 1,000 angstroms to 3,000 angstroms in a direction perpendicular to a plane on which a base substrate is located.

It should be noted that, in at least one of following embodiments of the present disclosure, a spatial rectangular coordinate system is established with a base substrate as a reference, to describe positions of respective structures in an array substrate and a display panel. As illustrated in FIG. 1, in the spatial rectangular coordinate system, an X-axis and a Y-axis (not shown, which is perpendicular to the X-axis) are parallel to a first main surface 101 of a base substrate 100, and a Z-axis is perpendicular to the first main surface 101.

For example, in an array substrate provided by at least one embodiment of the present disclosure, an orthographic projection of a first electrode layer on a transparent base substrate is located within an orthographic projection of an anti-reflective layer on the transparent base substrate, or coincides with the orthographic projection of the anti-reflective layer on the transparent base substrate. Exemplarily, as illustrated in FIG. 1, in a direction of a Z axis, an orthographic projection of a first electrode layer 220 on a base substrate 100 is located within an orthographic projection of an anti-reflective layer 210 on the base substrate 100, or coincides with the orthographic projection of the anti-reflective layer 210 on the base substrate 100. Thus, in the direction of the Z axis, the anti-reflective layer 210 may completely shade the first electrode layer 220, to further reduce an electrode structure's light reflectivity, and further increase a display effect of the array substrate.

It should be noted that, in at least one embodiment of the present disclosure, a structure of an anti-reflective layer will not be limited, as long as the anti-reflective layer can reduce an electrode structure's reflection of light.

For example, in an array substrate provided by at least one embodiment of the present disclosure, an anti-reflective layer includes a first film layer and a second film layer stacked on each other; the first film layer is located between a first electrode layer and the second film layer; the first film layer and the second film layer differ in refractive index; and a thickness of the first film layer may be set such that light of a predetermined wavelength reflected at an interface between the first film layer and the second film layer and light reflected on a surface of the first electrode layer that faces the anti-reflective layer perform destructive interference. Due to a difference in refractive index between the first film layer and the second film layer, the incident light is reflected at the interface between the first film layer and the second film layer; in this way, by adjusting a thickness of the first film layer, light reflected at the interface between the first film layer and the second film layer and light reflected at the interface between the first film layer and the first electrode layer can perform destructive interference, thereby reducing an electrode structure's reflection of light.

Figure 2A:
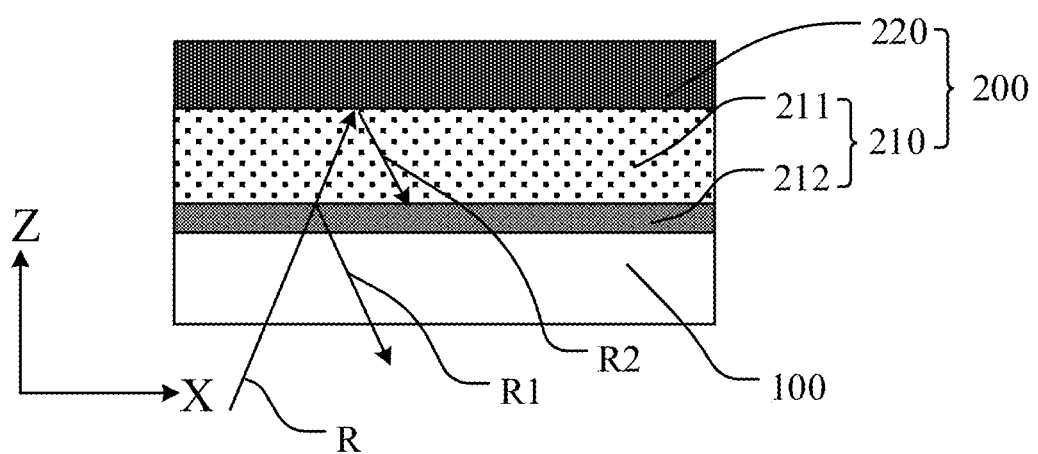
FIG. 2A is a cross-sectional view of an electrode structure in the array substrate illustrate in FIG. 1.

FIG. 2A is a cross-sectional view of a structure of the electrode structure in the array substrate illustrate in FIG. 1. Exemplarily, as illustrated in FIG. 2A, an anti-reflective layer 210 includes a first film layer 211 and a second film layer 212 that are stacked; and the first film layer 211 is located between the second film layer 212 and a first electrode layer 220. With respect to incident light R incident from the side of the base substrate 100 into an electrode structure 200, a first light portion R1 of the incident light R is reflected at an interface between the first film layer 211 and the second film layer 212. A second light portion R2 incident onto the first film layer 211 is reflected by a surface of the first electrode layer 220 that faces the first film layer 211, and then propagates to the interface between the first film layer 211 and the second film layer 212. It should be noted that, under a condition for implementing destructive interference, a thickness of the first film layer is determined by a refractive index relationship between the first film layer and the second film layer, which will be described below respectively.

For example, in an array substrate provided by at least one embodiment of the present disclosure, a refractive index of a second film layer in an anti-reflective layer is larger than a refractive index of a first film layer in an anti-reflective layer. As illustrated in FIG. 2A, a first light portion R1 reflected at an interface between a first film layer 211 and a second film layer 212 does not generate phase mutation (half-wave loss), and does not generate an additional optical path difference. If an optical thickness of the first film layer 211 is designed such that a phase difference between the second light portion R2 and the first light portion R1 is 180 degrees in the case that the second light portion R2 is reflected by a first electrode layer 220 and reaches the interface between the first film layer 211 and the second film layer 212, then destructive interference occurs between the first light portion R1 and the second light portion R2. For example, the phase difference between the first light portion R1 and the second light portion R2 is adjusted according to the optical thickness (a product of the refractive index and a thickness) of the first film layer 211.

For example, in an array substrate provided by at least one embodiment of the present disclosure, in a case where a refractive index of a second film layer in an anti-reflective layer is larger than a refractive index of a first film layer in an anti-reflective layer, the first film layer in an electrode structure is configured to eliminate light of a predetermined wavelength, and an optical thickness of the first film layer is set to an odd multiple of a quarter of the predetermined wavelength. In this way, at an interface between the first film layer and the second film layer, an optical path difference between a portion of the light of the predetermined wavelength that is reflected by the first film layer (i.e., a first light portion R1 in FIG. 2A) and a portion thereof that is reflected by a first electrode layer (i.e., a second light portion R2 in FIG. 2A) is an odd multiple of a half wavelength; and accordingly, the two light portions have opposite phases, and destructive interference occurs between the two light portions. In this way, the anti-reflective layer having the above-described structure may reduce or eliminate the electrode structure's reflection of the light of the predetermined wavelength, thereby increasing a display effect of the array substrate.

For example, in an array substrate provided by at least one embodiment of the present disclosure, a refractive index of a second film layer is smaller than a refractive index of a first film layer in an anti-reflective layer. In this way, as illustrated in FIG. 2A, a first light portion R1 reflected at an interface between the first film layer 211 and the second film layer 212 will generate phase mutation (half-wave loss), and generate an additional optical path difference equal to a half wavelength of light of a predetermined wavelength. For example, the first film layer 211 is set to eliminate the light of the predetermined wavelength, and an optical thickness of the first film layer 211 is an integer multiple of one-half of the predetermined wavelength. In this way, at the interface between the first film layer 211 and the second film layer 212, an optical path difference between the first light portion R1 and a second light portion R2 is an odd multiple of a half wavelength, accordingly, the first light portion R1 and the second light portion R2 have opposite phases, and destructive interference occurs between the first light portion R1 and the second light portion R2. In this way, an anti-reflective layer 210 having the above-described structure may reduce or eliminate reflection of an electrode structure 200 with respect to the light of the predetermined wavelength, thereby increasing a display effect of the array substrate.

In at least one embodiment of the present disclosure, a wavelength range of the above-described light of the predetermined wavelength will not be limited. For example, the predetermined wavelength is a central wavelength of light in a specific wavelength range. For example, the light in the specific wavelength range is visible light. For example, the predetermined wavelength may be from 430 nanometers to 700 nanometers, and may further be, for example, 460 nanometers, 550 nanometers, 620 nanometers, or the like.

For example, in an array substrate provided by at least one embodiment of the present disclosure, an anti-reflective layer includes a plurality of anti-reflective film groups sequentially arranged on a side of a first electrode layer that faces a transparent base substrate; each anti-reflective film group includes a first film layer closer to the first electrode layer and a second film layer closer to the transparent base substrate; the first film layer and the second film layer differ in refractive index; and a thickness of the first film layer may be set such that light of a predetermined wavelength reflected at an interface between the first film layer and the second film layer and light reflected on a surface of the first electrode layer that faces the anti-reflective layer perform destructive interference. In this way, each anti-reflective film group may be set to cause destructive interference to the light of the predetermined wavelength, so that the anti-reflective layer cane further reduce reflection of the light of the predetermined wavelength, or the anti-reflective layer may cause destructive interference among light of various wavelengths, thereby further reducing an electrode structure's reflection of light, and increasing a display effect of the array substrate. It should be noted that, for a refractive index relationship between a first film layer and a second film layer in each anti-reflection group, and a thickness of the first film layer, the related description in the foregoing embodiments (for example, the embodiment related to FIG. 2A) may be referred to, and no details will be repeated here.

Hereinafter, with a case where a refractive index of a first film layer is smaller than a refractive index of a second film layer in an anti-reflective layer as an example, technical solutions in at least one of following embodiments of the present disclosure will be described.

Figure 2B:
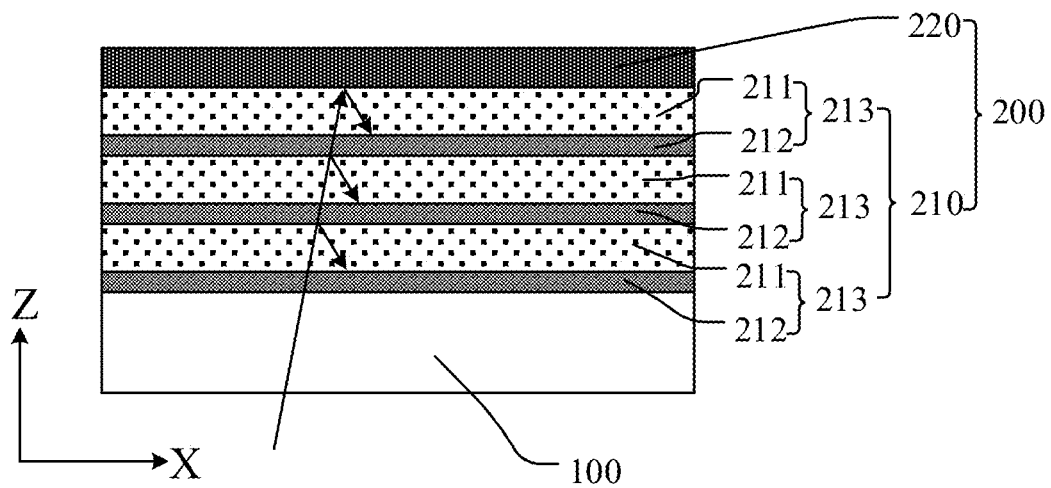
FIG. 2B is a cross-sectional view of another electrode structure in the array substrate illustrate in FIG. 1.

FIG. 2B is a cross-sectional view of another structure of the electrode structure in the array substrate illustrate in FIG. 1. Exemplarily, as illustrated in FIG. 2B, an anti-reflective layer 200 includes a plurality of anti-reflective film groups 213; each anti-reflective film group 213 includes a first film layer 211 and a second film layer 212; and a refractive index of the first film layer 211 is smaller than a refractive index of the second film layer 212. The plurality of anti-reflective film groups 213 are stacked between a first electrode layer 220 and a base substrate 100; and in each anti-reflective film group 213, a first film layer 211 is located between the first electrode layer 220 and a second film layer 212. For example, for the structures of the first film layer 211 and the second film layer 212 in each anti-reflective film group 213, the related description of the first film layer 211 and the second film layer 212 according to the embodiment illustrate in FIG. 2A may be referred to, and no details will be repeated here.

For example, in at least one embodiment of the present disclosure, optical thicknesses of first film layers in all anti-reflective film groups in an electrode structure are set to be equal. In this way, the electrode structure's reflection of light of a predetermined wavelength can be further reduced, and a display effect of an array substrate can be further increased.

For example, in at least one embodiment of the present disclosure, optical thicknesses of first film layers in at least two anti-reflective film groups in an electrode structure are set to be unequal to each other. In this way, the electrode structure may reduce reflection of lights of at least two predetermined wavelengths, thereby increasing a wavelength range of light that can be anti-reflected in the electrode structure, and further increasing a display effect of an array substrate.

Exemplarily, as illustrated in FIG. 2B, an electrode structure 200 includes three stacked anti-reflective film groups 213. Among the three anti-reflective film groups 213, a first film layer 211 in one of the three anti-reflective film groups 213 is set to eliminate red light of a predetermined wavelength, and an optical thickness of the first film layer 211 is a quarter of a central wavelength of the red light, for example, the central wavelength of the red light is 620 nanometers; a first film layer 211 in one of the three anti-reflective film groups 213 is set to eliminate green light of a predetermined wavelength, and an optical thickness of the first film layer 211 is a quarter of a central wavelength of the green light, for example, the central wavelength of the green light is 550 nanometers; a first film layer 211 in the another one of the three anti-reflective film groups 213 is set to eliminate blue light of a predetermined wavelength, and an optical thickness of the first film layer 211 is a quarter of the central wavelength of the blue light, for example, the central wavelength of the blue light is 460 nanometers. In this way, the electrode structure 200 may cause destructive interference among portions of the red light, the green light and the blue light, thereby reducing or eliminating reflection of the electrode structure 200 with respect to the portions of the red light, the green light and the blue light, and further increasing the display effect of the array substrate.

In at least one embodiment of the present disclosure, a structure of a second film layer of an anti-reflective layer will not be limited, as long as the second film layer transmits a portion of light and reflects a portion of light. For example, light is reflected on a surface of the second film layer that is away from a first film layer, or is reflected at an interface between the second film layer and the first film layer. For example, in some embodiments of the present disclosure, as described in the foregoing embodiment, a refractive index of a second film layer is different from a refractive index of a first film layer, so that light is reflected at an interface between the first film layer and the second film layer. For example, in other embodiments of the present disclosure, a second film layer is a film layer that is at least partially transparent and has higher light reflectivity, so that a portion of incident light is transmitted through the second film layer, and the other portion of the incident light is reflected by the second film layer. Hereinafter, a structure of the anti-reflective layer will be described with a case where the second film layer is a film layer that is at least partially transparent and has higher light reflectivity as an example.

For example, in an array substrate provided by at least one embodiment of the present disclosure, an anti-reflective layer includes a first film layer and a second film layer stacked on each other; the first film layer is located between a first electrode layer and the second film layer. The second film layer is a partially transparent metal layer, and the first film layer is a transparent layer. Thicknesses of the first film layer and the second film layer are set such that light of a predetermined wavelength reflected on a surface of the first electrode layer that faces the anti-reflective layer and light reflected on a surface of the partially transparent metal layer (the second film layer) that is away from the first film layer perform destructive interference.

Figure 2C:
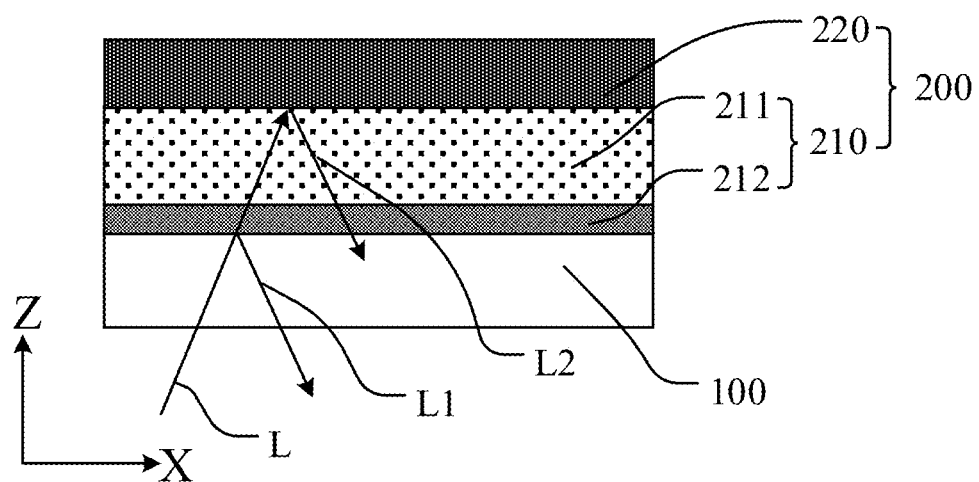
FIG. 2C is a cross-sectional view of yet another electrode structure in the array substrate illustrate in FIG. 1.

FIG. 2C is a cross-sectional view of another structure of the electrode structure in the array substrate illustrate in FIG. 1. Exemplarily, as illustrated in FIG. 2C, light absorption by film layers in the electrode structure is not considered. With respect to incident light L incident from the side of the base substrate 100 into an electrode structure 200, a first light portion L1 of the incident light L is reflected on a surface of a second film layer 212 that is away from a first film layer 211. A second light portion L2 of the incident light L incident onto the first film layer 211 is reflected by a surface of the first electrode layer 220 that faces the first film layer 211 and then is transmitted through the second film layer 212. In the above-described process, if the phase difference between the first light portion L1 and the second light portion L2 at the surface of the second film layer 212 that is away from the first film layer 211 is 180 degrees, then destructive interference occurs between the first light portion L1 and the second light portion L2. For example, an anti-reflective layer 210 is configured to eliminate light of a predetermined wavelength; and a sum of optical thicknesses of the first film layer 211 and the second film layer 212 is an odd multiple of a quarter of the predetermined wavelength.

For example, in an array substrate according to at least one embodiment of the present disclosure, in a case where a second film layer in an electrode structure is a metal layer, the metal layer absorbs more light, and a peak value of the light transmitted through the metal layer decreases, so that it is difficult for the light to be emergent from the metal layer (the second film layer) after being incident onto the first film layer, thereby reducing an amount of light emergent from the second film layer among the light incident onto the first film layer, which, in combination with destructive interference, can further reduce the electrode structure's reflection of light.

In at least one embodiment of the present disclosure, in the case where a second film layer is a partially transparent metal layer, a thickness of the second film layer will not be limited as long as the second film layer can transmit light. For example, in at least one embodiment of the present disclosure, a thickness of a second film layer (a metal layer) is equal to or smaller than 100 nanometers, for example, the thickness of a second film layer is 50 nanometers, 30 nanometers, 15 nanometers, 5 nanometers, or the like.

For example, in an array substrate provided by at least one embodiment of the present disclosure, light reflectivity of a first electrode layer is larger than light reflectivity of a second film layer, which, thus, can prevent light in a first film layer from being transmitted through the first electrode layer, and prevent light from adversely affecting other components when incident onto the array substrate, or adversely affecting a display effect when reflected within the array substrate and emitted out. For example, a thickness of the first electrode layer is set to be larger than a thickness of the second film layer.

For example, in an array substrate provided by at least one embodiment of the present disclosure, a first film layer is an inorganic transparent layer or an organic transparent layer. For example, the first film layer may be doped with a light absorbing material that absorbs visible light (for example, red light, green light and blue light, etc.), for example, copper phthalocyanine (CuPc) and 8-hydroxyquinoline aluminum (Alq3), etc. For example, a material of the inorganic transparent layer may include silicon nitride, silicon oxide, copper oxide and molybdenum oxide, etc. A material of the organic transparent layer may include N,N'-bis (1-naphthyl)-N,N'-diphenyl-1,1'-biphenyl-4-4'-diamine (NPB), rubrene, or other transparent organic polymer resins, etc. For example, in at least one embodiment of the present disclosure, a first film layer is made of molybdenum oxide.

For example, in an array substrate provided by at least one embodiment of the present disclosure, a second film layer may be made of a metal such as molybdenum, chromium, copper, aluminum, silver, and a niobium molybdenum alloy.

Metals such as molybdenum and metal oxides such as molybdenum oxide have low light reflectivity and large absorption of light (for example, a large extinction coefficient). In at least one embodiment of the present disclosure, a first film layer is a metal oxide such as molybdenum oxide and a second film layer is a metal such as molybdenum, which can absorb incident light, thereby further reducing an electrode structure's reflection of light.

Figure 3A:
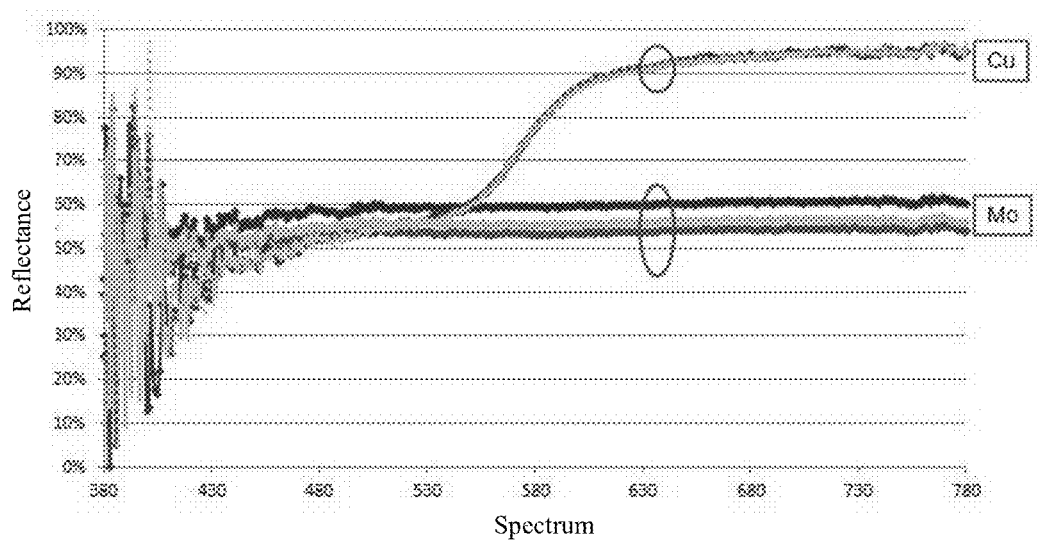
FIG. 3A is a spectrogram showing reflectivity of copper and reflectivity of molybdenum provided by an embodiment of the present disclosure.

FIG. 3A is a spectrogram showing light reflectivities of copper and molybdenum provided by an embodiment of the present disclosure. As illustrated in FIG. 3A, on a side of a metal layer (a second film layer) that faces a base substrate, as compared with a second film layer made of copper, a second film layer made of molybdenum has smaller light reflectivity against light in a visible light range, which reduces reflection of light.

It should be noted that, in at least one embodiment of the present disclosure, materials of a first film layer and a second film layer will not be limited, as long as the first film layer and the second film layer may cause destructive interference to light in the first film layer. Hereinafter, technical solutions in at least one of following embodiments of the present disclosure will be described with a case where the first film layer is made of molybdenum oxide and the second film layer is made of molybdenum or a niobium molybdenum alloy as an example.

Figure 3B:
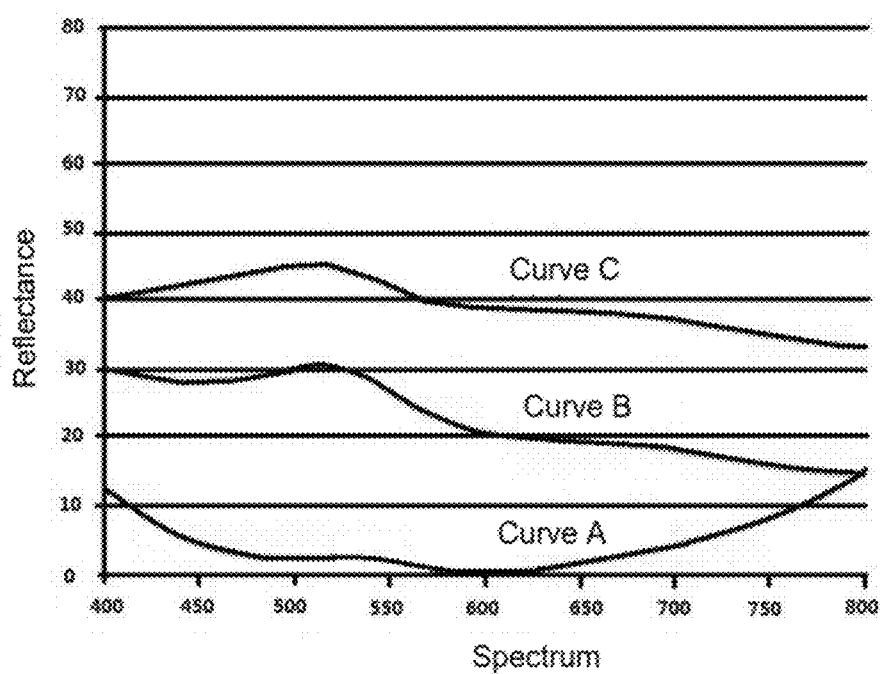
FIG. 3B is a spectrogram showing light reflectivities of an electrode structure provided by an embodiment of the present disclosure.

FIG. 3B is a spectrogram of light reflectivity of an electrode structure provided by an embodiment of the present disclosure. Curves A, B and C respectively reflect light reflectivity of an anti-reflective layer constituted by a first film layer and a second film layer with different thicknesses, herein, the first film layer is made of molybdenum oxide, and the second film layer is made of molybdenum or a niobium molybdenum alloy. As illustrated in FIG. 3B, the thickness of the first film layer is 50 nanometers, and the thickness of the second film layer is 5 nanometers in curve A; the thickness of the first film layer is 40 nanometers, and the thickness of the second film layer is 15 nanometers in the curve B; the thickness of the first film layer is 5 nanometers, and the thickness of the second film layer is 30 nanometers in curve C. As illustrated in FIG. 3B, as compared with the anti-reflective layer represented by curves B and C, the thickness of the first film layer in curve A is 50 nanometers, destructive interference occurs to light having a wavelength of about 600 nanometers in the first film layer. Because the thickness of the first film layer is large, absorption of light is increased. Moreover, because the thickness of the second film layer is small, the second film layer has low light reflectivity against light incident from the side of the base substrate, and has large absorption of light. In this way, the anti-reflective layer in curve A is superior to the anti-reflective layer in curves B and C in terms of an effect of reducing reflection of light. Exemplarily, as illustrated in FIG. 3B, in a wave band of 450 nanometers to 700 nanometers, light reflectivity of the electrode structure having the anti-reflective layer in curve A against light is below 5%.

For example, in at least one embodiment of the present disclosure, an array substrate comprises a plurality of signal lines and a plurality of thin film transistors; and at least a portion of at least one of the signal line and the thin film transistor is set as a first electrode layer in an electrode structure. For example, an anti-reflective layer is provided on only a portion of a region of the signal line, in this way, the portion of the signal line that is covered by the anti-reflective layer serves as the first electrode layer in the electrode structure, and the anti-reflective layer and the portion of the signal line that is covered by the anti-reflective layer constitute the electrode structure. For example, an anti-reflective layer is provided on the whole signal line, in this way, the signal line and the anti-reflective layer thereon constitute the electrode structure, and the entire signal line serves as the first electrode layer in the electrode structure. In a region provided with the signal line that includes the first electrode layer in the electrode structure according to the foregoing embodiment and the thin film transistor, light reflectivity of the array substrate against light (for example, ambient light) is low, thereby increasing contrast of a display image and increasing a display effect of the array substrate (or a display panel comprising the array substrate).

For example, in an array substrate provided by at least one embodiment of the present disclosure, a type of a thin film transistor will not be limited. The thin film transistor may be of a top-gate type, a bottom-gate type, a double-gate type, or other type.

For example, the thin film transistor may include a gate electrode, a source electrode and a drain electrode, etc. At least one of the gate electrode, the source electrode and the drain electrode may be set to at least partially include the first electrode layer in the electrode structure according to the foregoing embodiments. For example, in a case where the thin film transistor is a top-gate type, a light-shielding layer (e.g., a metal layer) may be provided between an active layer of the thin film transistor and a base substrate; and the light-shielding layer is used to shield light irradiated from the side of the base substrate toward the active layer. For example, the light-shielding layer is a metal layer. Although the light-shielding layer can shade the active layer, in a case of a separate light-shielding layer, the light-shielding layer has high light reflectivity against incident light, which adversely affects a display effect of a display image. For example, in at least one embodiment of the present disclosure, a light-shielding layer is set as the first electrode layer in the electrode structure according to the above-described embodiments, and thus, a side of the light-shielding layer that faces a base substrate is covered by an anti-reflective layer, that is, the light-shielding layer and the anti-reflective layer together constitute the electrode structure, thereby reducing reflection of incident light and increasing a display effect of the array substrate (or a display panel comprising the array substrate).

For example, in at least one embodiment of the present disclosure, type of the signal line that may include the above-described electrode structures will not be limited. For example, the signal line may be a gate line, a data line, a common electrode line, a frame scan line, or the like.

In at least one embodiment of the present disclosure, a specific structure of an array substrate will not be limited, and may be determined according to application requirements of the array substrate.

For example, in at least one embodiment of the present disclosure, as illustrated in FIG. 1, an array substrate 10 comprises a pixel electrode 700 provided on a base substrate 100. The pixel electrode 700 is electrically connected with a drain electrode in a thin film transistor 400. For example, in at least one embodiment of the present disclosure, an array substrate may further comprise a common electrode 800.

For example, in an array substrate according to at least one embodiment of the present disclosure, a pixel electrode 700 and a common electrode 800 may be provided in a same layer, or as illustrated in FIG. 1, the common electrode 800 is located between the pixel electrode 700 and a base substrate 100. For example, the array substrate 10 may be applied to a field of liquid crystal display.

For example, in at least one embodiment of the present disclosure, as illustrated in FIG. 1, a pixel electrode 700 and a common electrode 800 are transparent electrodes or translucent electrodes. For example, materials of the pixel electrode 700 and the common electrode 800 may include indium tin oxide (ITO), indium zinc oxide (IZO), indium gallium oxide (IGO), gallium zinc oxide (GZO), zinc oxide (ZnO), indium oxide (In2O3), aluminum zinc oxide (AZO) and carbon nanotubes, etc.

For example, in at least one embodiment of the present disclosure, being transparent may indicate light transmittance of 75% to 100%, and being translucent may indicate light transmittance of 50% to 75%.

Figure 4:
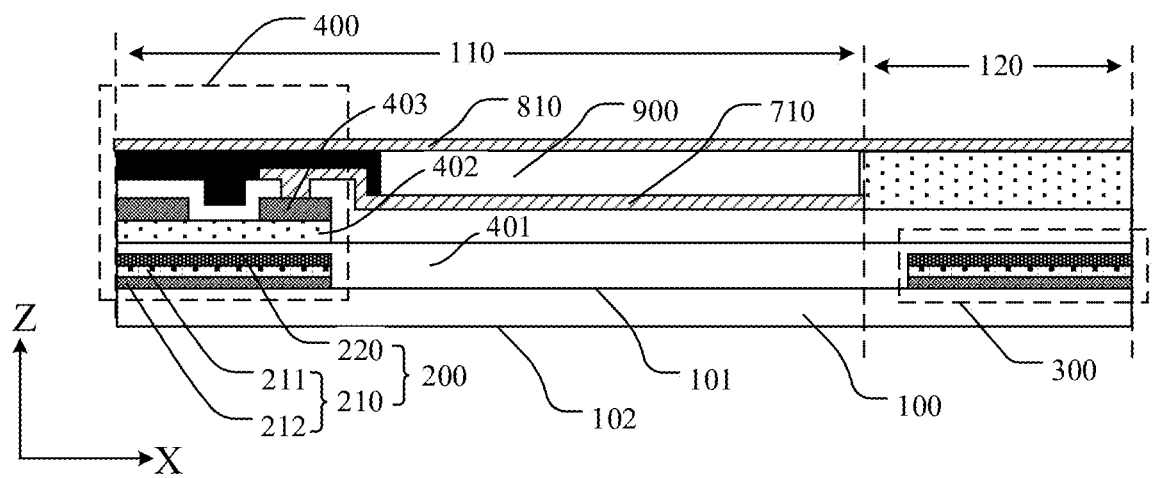
FIG. 4 is a cross-sectional view of a partial structure of another array substrate provided by an embodiment of the present disclosure.

FIG. 4 is a cross-sectional view of a partial structure of another array substrate provided by an embodiment of the present disclosure.

For example, in at least one embodiment of the present disclosure, an array substrate may be an organic light emitting diode (OLED) substrate. For example, as illustrated in FIG. 4, an organic light emitting device may be provided in an array substrate 10. The organic light emitting device includes a first driving electrode 710, an organic light-emitting functional layer 900 and a second driving electrode 810; and the organic light-emitting functional layer 900 is located between the first driving electrode 710 and the second driving electrode 810. For example, the second driving electrode 810 may be set as a reflecting electrode, so that all light emitted by the organic light-emitting functional layer 900 may be emergent from the side of the base substrate 100, thereby increasing a utilization rate of light.

For example, in at least one embodiment of the present disclosure, an organic light-emitting functional layer includes an organic light-emitting layer. For example, the organic light-emitting functional layer may further include one or a combination of a hole injection layer, a hole transport layer, an electron transport layer and an electron injection layer, etc. For example, in an organic light emitting device, one of a first driving electrode 710 and a second driving electrode 810 may be an anode, and the other of the first driving electrode 710 and the second driving electrode 810 is a cathode. For example, in the organic light emitting device, the anode, the hole injection layer, the hole transport layer, the organic light-emitting layer, the electron transport layer, the electron injection layer and the cathode are sequentially stacked. For example, the organic light-emitting functional layer may be further provided with an electron blocking layer and a hole blocking layer; the electron blocking layer is located between the anode and the organic light-emitting layer, and the hole blocking layer is located between the cathode and the organic light-emitting layer, which will not be limited thereto. For example, the hole blocking layer or the electron blocking layer may be made of an organic material.

For example, in the organic light-emitting functional layer, the organic light-emitting layer may emit red light, green light, blue light, yellow light, etc., depending on an organic light-emitting material used. This embodiment is not limited to the colors of light emitted by the organic light-emitting layer. In addition, according to needs, the organic light-emitting material of the organic light-emitting layer according to this embodiment includes a fluorescent light-emitting material or a phosphorescent light-emitting material. For example, the organic light-emitting layer may adopt a doping system, that is, a dopant material is mixed into a host light-emitting material to obtain a usable light-emitting material. For example, the host light-emitting material may be a metal complex material, an anthracene derivative, an aromatic diamine compound, a triphenylamine compound, an aromatic triamine compound, a biphenyldiamine derivative, or a triarylamine polymer, etc.

In at least one embodiment of the present disclosure, a base substrate may be a rigid substrate; or an array substrate may also be a flexible substrate, so that the array substrate may be applied to a flexible display field. In at least one embodiment of the present disclosure, a type and a material of a base substrate will not be limited as long as the base substrate is a transparent substrate. For example, in a case where an array substrate is a rigid substrate, the base substrate may be a glass plate, a quartz plate or a resin plate, etc. For example, in a case where the array substrate is a flexible substrate, the material of the base substrate may include an organic material, for example, the organic material may be a resin material such as polyimide, polycarbonate, polyacrylate, polyetherimide, polyethersulfone, polyethylene terephthalate and polyethylene naphthalate.

At least one embodiment of the present disclosure provides a display panel, comprising the array substrate according to any one of the foregoing embodiments. For example, in a display panel provided by at least one embodiment of the present disclosure, a touch substrate may be provided on a display side of the display panel so that the display panel obtains a touch display function. For example, the touch substrate is located on a side of the base substrate that is away from an electrode structure.

For example, a display panel provided by at least one embodiment of the present disclosure further comprises a counter substrate provided opposite to an array substrate; a second main surface of the array substrate is located on a display side of the display panel, that is, a side where an observer is located; and a first main surface of the array substrate faces towards the counter substrate.

Figure 5A:
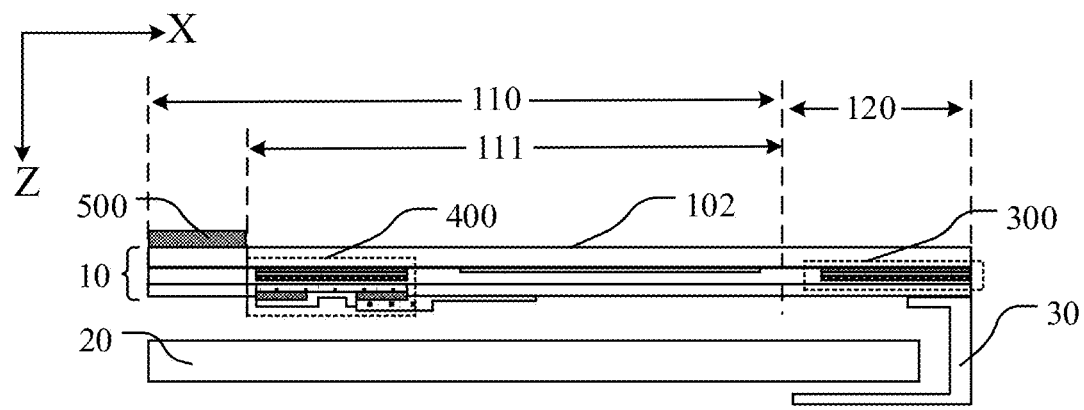
FIG. 5A is a cross-sectional view of a partial structure of a display panel provided by an embodiment of the present disclosure.
Figure 5B:
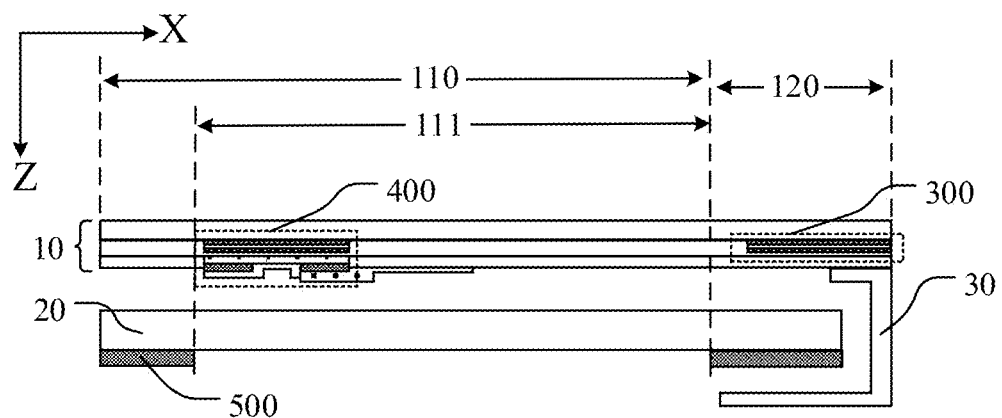
FIG. 5B is a cross-sectional view of a partial structure of another display panel provided by an embodiment of the present disclosure.

FIG. 5A is a cross-sectional view of a partial structure of a display panel provided by an embodiment of the present disclosure; and FIG. 5B is a cross-sectional view of a partial structure of another display panel provided by an embodiment of the present disclosure.

Exemplarily, as illustrated in FIG. 5A and FIG. 5B, the display panel comprises an array substrate 10 and a counter substrate 20 provided opposite to each other. A second main surface 102 of the array substrate 10 is located on a display side of the display panel. The display panel having the above-described structure is favorable for implementing narrow frame or frameless design.

For example, in at least one embodiment of the present disclosure, a display panel further comprises a flexible circuit board 30; an array substrate comprises a display region 110 and a non-display region 120; a bonding region is provided in the non-display region 120; and the flexible circuit board 30 is fixed on the bonding region of the array substrate 10, to be electrically connected with a signal line in the array substrate 10. For example, as illustrated in FIG. 5A and FIG. 5B, the flexible circuit board 30 is bent so that an end of the flexible circuit board 30 that is away from the array substrate 10 is moved to a side of a counter substrate 20 that is away from the array substrate 10. In this way, the flexible circuit board 30 may be installed without bypassing a side surface of the array substrate 10; on a plane determined by X-Y, space additionally occupied by the flexible circuit board 30 is reduced, or it is not necessary to reserve additional space for the flexible circuit board 30, so that the display panel is favorable for implementing narrow frame or frameless design.

In at least one embodiment of the present disclosure, a type of a display panel will not be limited, and a specific structure of the display panel may be designed according to the type of the display panel. Hereinafter, a structure of a display panel according to at least one embodiment of the present disclosure will be described with a case where the display panel is a liquid crystal display panel or an OLED display panel as an example.

For example, in at least one embodiment of the present disclosure, a display panel is a liquid crystal display panel, and a counter substrate may be a color filter substrate. In a case where the display panel is a liquid crystal display panel, the related description in the embodiment illustrate in FIG. 1 may be referred to for an array substrate, and no details will be repeated here.

For example, in at least one embodiment of the present disclosure, a display panel is an OLED display panel, and a counter substrate may be a package cover plate. In a case where the display panel is an OLED display panel, the related description in the embodiment illustrate in FIG. 4 may be referred to for an array substrate, and no details will be repeated here.

For example, a display panel provided by at least one embodiment of the present disclosure further comprises a black matrix, the black matrix is located on a counter substrate; or the black matrix is located on an array substrate, so as to at least shade, on a display side, a portion of a signal line and a portion of a thin film transistor that does not included in a first electrode layer in an electrode structure. For example, the black matrix may be black paint. The black matrix is provided in a predetermined region of the array substrate to shade the predetermined region, thereby preventing external light from being incident onto the predetermined region of the display panel, or preventing light in the display panel from being emergent from the predetermined region, as a result, contrast of a display image of the display panel is increased, and a display effect of the display panel is increased. With respect to the above-described display panel, a portion of the signal line and the thin film transistor that includes the first electrode layer are covered by an anti-reflective layer, which has low light reflectivity against light, and it may also be no longer necessary to provide the black matrix in the portion, which can reduce a coverage area of the black matrix, reduce a use amount of the black matrix, and reduce costs.

An arrangement mode of the black matrix is related to a type of the display panel; and hereinafter, different arrangement modes of the black matrix will be described in combination with the different types of the display panel.

For example, in a display panel provided by at least one embodiment of the present disclosure, a black matrix is located on an array substrate to at least shade a portion of a signal line and a thin film transistor that does not includes a first electrode layer in an electrode structure on a display side. In this way, it is not necessary to additionally provide the black matrix in a portion provided with the signal line and the thin film transistor that includes the electrode structure according to the above-described embodiment, which can reduce an area of the black matrix, so as to reduce a use amount of the black matrix and reduce costs. For example, the display panel may be an OLED display panel or a liquid crystal display panel.

Exemplarily, as illustrated in FIG. 5A, a signal line of an array substrate 10 that is located in a non-display region 120 is set as the first electrode layer in the electrode structure according to the foregoing embodiment. In this way, an upper side of the signal line 300 in the non-display region 120 is all covered with an anti-reflective layer (the term "upper side" here refers to a side of the signal line 300 that is close to a base substrate, that is, the side of the signal line 300 that is close to the base substrate is provided with the anti-reflective layer, as illustrated in FIG. 5A). The electrode structure composed of the signal line 300 and the anti-reflective layer has no reflection (or reduced reflection) of external ambient light; it is no longer necessary to provide the black matrix 500 in the non-display region 120, which can reduce an area of the black matrix. It may be understood that "cover" referred to here may be partial coverage or full coverage. In a case where the electrode structure is completely covered by the anti-reflective layer, the electrode structure's reflection of incident light can be minimized.

Exemplarily, as illustrated in FIG. 5A, the thin film transistor (such as a gate electrode, etc.) in the array substrate may also be set as the first electrode layer of the electrode structure according to the foregoing embodiment, so that the thin film transistor has reduced or no reflection of ambient light (or has low light reflectivity against ambient light). For example, structures such as the gate electrode and a source-drain electrode layer in the thin film transistor that can reflect light are all set as the first electrode layer in the electrode structure, that is, the structures such as the gate electrode, the source-drain electrode layer and the light-shielding layer are all covered by the anti-reflective layer. In this way, in the display region 110, it is not necessary to further provide the black matrix 500 in a region where the thin film transistor is located, thereby further reducing an area of the black matrix. For example, a plurality of sub-pixel regions 111 are provided in the display region 110 of the array substrate 10, and the black matrix 500 is located in the display region 110, and is located in a space region of the plurality of sub-pixel regions 111.

For example, in a display panel provided by at least one embodiment of the present disclosure, a black matrix is located on a counter substrate. For example, components such as a thin film transistor and a signal line on an array substrate that can reflect light are all set as the first electrode layer in the electrode structure according to the foregoing embodiment. Exemplarily, as illustrated in FIG. 5B, the black matrix 500 is located on the counter substrate 20; and a gate electrode and a source-drain electrode layer in the thin film transistor 400 as well as the signal line 300 are all set as the first electrode layer in the electrode structure according to the foregoing embodiment. In this way, on the array substrate 10, it is not necessary to further provide the black matrix 500 to shade the thin film transistor 400 and the signal line 300, thereby reducing a use amount of the black matrix. For example, the display panel is a liquid crystal display panel.

At least one embodiment of the present disclosure provides a display device, the display device comprising a display panel according to any one of the foregoing embodiments.

Figure 6:
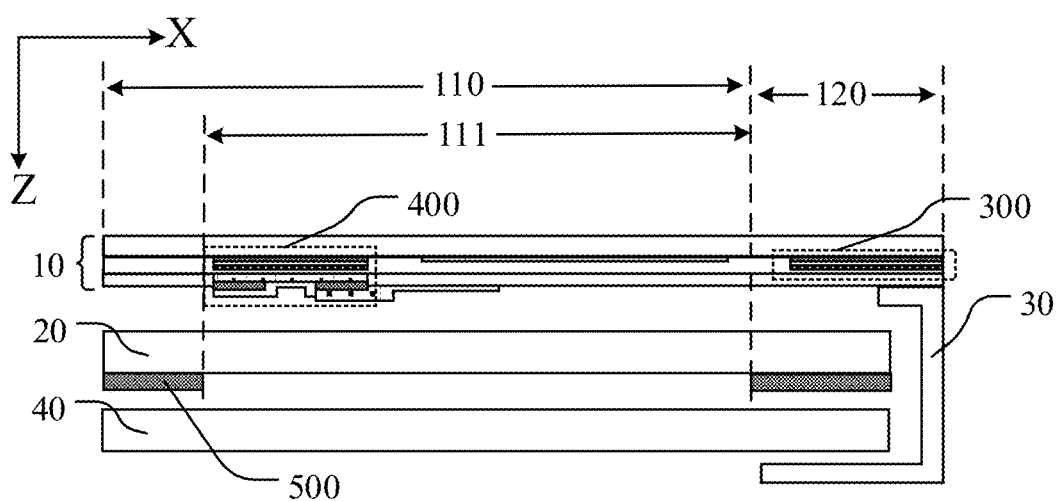
FIG. 6 is a cross-sectional view of a partial structure of another display device provided by an embodiment of the present disclosure.

FIG. 6 is a cross-sectional view of a partial structure of another display device provided by an embodiment of the present disclosure;

For example, in a display device provided by at least one embodiment of the present disclosure, the display panel is the liquid crystal display panel according to any one of the foregoing embodiments, and the display device further comprises a backlight source. Exemplarily, as illustrated in FIG. 6, the display device comprises a display panel (comprising an array substrate 10 and a counter substrate 20) and a backlight source 40; and the backlight source 40 is located on a side of the counter substrate 20 that is away from the array substrate 10.

For example, in a display device provided by at least one embodiment of the present disclosure, the backlight source is a planar light source, and may be a module composed of a light source and a light guide plate, etc. For example, the backlight source may be a backlight module of a direct-lit type, or may also be a backlight module of a side-lit type.

For example, in a display device provided by at least one embodiment of the present disclosure, in a case where a backlight source is a backlight module of a side-lit type, as illustrated in FIG. 6, an end of a flexible circuit board 30 that is away from an array substrate 10 may be located on a side of the backlight source 40 that is away from the array substrate 10. In this way, arrangement of the flexible circuit board 30 does not adversely affect light emission of the backlight source, and a design thickness of the entire display device is reduced.

At least one embodiment of the present disclosure provides a manufacturing method of an array substrate, comprising: providing a transparent base substrate; patterning the transparent base substrate to form an anti-reflective layer and a first electrode layer so as to obtain an electrode structure, herein, the anti-reflective layer is formed between the first electrode layer and the transparent base substrate to reduce the electrode structure's reflection of light incident from a second main surface of the transparent base substrate onto the electrode structure. In the array substrate obtained by using the above-described manufacturing method, the anti-reflective layer in the electrode structure can reduce reflection of light incident from the second main surface of the base substrate, so that the electrode structure has reduced or no reflection of light, thereby reducing the array substrate's reflection of light, and increasing contrast of a display image of the array substrate and a display panel comprising the array substrate, so as to increase a display effect.

For example, in a manufacturing method of an array substrate provided by at least one embodiment of the present disclosure, the forming an anti-reflective layer includes: forming a second film layer on a base substrate; and forming a transparent first film layer on a side of the second film layer that is away from the base substrate, the first film layer and the second film layer differing in refractive index. Herein, the first film layer is formed such that light of a predetermined wavelength reflected at an interface between the first film layer and the second film layer and light reflected on a surface of a first electrode layer that faces the first film layer perform destructive interference. Exemplarily, a transparent material thin film is deposited on the base substrate and subjected to a patterning process to form the second film layer; and a transparent material thin film is deposited on a side of the second film layer that is away from the base substrate and subjected to a patterning process to form the first film layer. With respect to the array substrate obtained by using the manufacturing method, due to the difference between the reflective index of the first film layer and the reflective index of the second film layer, incident light is reflected at the interface between the first film layer and the second film layer, in this way, by controlling formation conditions, a thickness of the first film layer may be adjusted, so that destructive interference may occur to at least a portion of light in the first film layer, thereby reducing an electrode structure's reflection of light.

For example, in a manufacturing method of an array substrate provided by at least one embodiment of the present disclosure, the forming an anti-reflective layer includes: sequentially forming a plurality of anti-reflective film groups stacked on a base substrate to obtain the anti-reflective layer. Herein, with respect to each anti-reflective film group, a second film layer is formed on the base substrate, a first film layer is formed on a side of the second film layer that is away from the base substrate, the first film layer and the second film layer differ in refractive index, and the first film layer is formed such that light of a predetermined wavelength reflected at an interface between the first film layer and the second film layer and light reflected on a surface of the first electrode layer that faces the first film layer perform destructive interference. Exemplarily, a transparent material thin film is deposited on the base substrate and subjected to a patterning process to form the second film layer; a transparent material thin film is deposited on a side of the second film layer that is away from the base substrate and subjected to a patterning process to form the first film layer; and the first film layer and the second film layer are formed into an anti-reflective film group. With respect to the array substrate obtained by using the manufacturing method, each anti-reflective film group may be formed such that destructive interference occurs to the light of the predetermined wavelength, so that the anti-reflective layer can further reduce reflection of the light of the predetermined wavelength, or the anti-reflective layer can cause destructive interference to light of various wavelengths, thereby further reducing an electrode structure's reflection of light, and increasing a display effect of the array substrate.

For example, in a manufacturing method of an array substrate provided by at least one embodiment of the present disclosure, the forming an anti-reflective layer includes: forming a partially transparent metal material thin film on a base substrate as a second film layer; and forming a transparent material thin film on a side of the second film layer that is away from the base substrate as a first film layer; herein, the anti-reflective layer includes the first film layer and the second film layer, and thicknesses of the first film layer and the second film layer are formed such that light of a predetermined wavelength reflected on a surface of the first electrode layer that faces the first film layer and light reflected on a surface of a partially transparent metal layer that is away from the first film layer perform destructive interference. Exemplarily, the partially transparent metal material thin film is deposited on the base substrate and subjected to a patterning process to form the second film layer; and the transparent material thin film is deposited on the side of the second film layer that is away from the base substrate and subjected to a patterning process to form the first film layer. With respect to the array substrate obtained by using the manufacturing method, light reflectivity of the metal layer is relatively high on the side of the metal layer (the second film layer) that faces the first film layer, so the reflection of light in the first film layer incident on the metal layer is increased, thereby reducing an amount of light emergent from the second film layer, and further reducing the electrode structure's reflection of light on a basis of destructive interference.

For example, in a manufacturing method of an array substrate provided by at least one embodiment of the present disclosure, a material of a first film layer includes molybdenum oxide, and a method of forming the first film layer includes: providing a pre-fabricated molybdenum oxide target, and forming a molybdenum oxide thin film on a base substrate as the first film layer by magnetron sputtering; or providing pre-fabricated molybdenum target and oxygen, and forming a molybdenum oxide thin film on the base substrate as the first film layer by magnetron sputtering. For example, after the molybdenum oxide thin film is formed, a patterning process is performed on the molybdenum oxide thin film to form the first film layer. For example, a material of a second film layer includes at least one of molybdenum and a niobium molybdenum alloy. Molybdenum and molybdenum oxide have large absorption of light and low light reflectivity, thereby further reducing an electrode structure's reflection of light.

For a structure of the array substrate obtained according to the above-described manufacturing method, the related description in the foregoing embodiments may be referred to, and no details will be repeated here. Hereinafter, with a case where the array substrate is an array substrate as an example, a fabrication method of the array substrate will be described in detail.

FIG. 7A to FIG. 7E are schematically views showing procedure steps of a fabrication method of an array substrate provided by an embodiment of the present disclosure. Hereinafter, with fabrication of the array substrate illustrate in FIG. 1 as an example, a preparation process of the array substrate will be described in detail in conjunction with FIG. 7A to FIG. 7E. In an electrode structure of the array substrate to be formed, a material of a first film layer includes molybdenum oxide, and a material of a second film layer includes molybdenum.

Figure 7A:
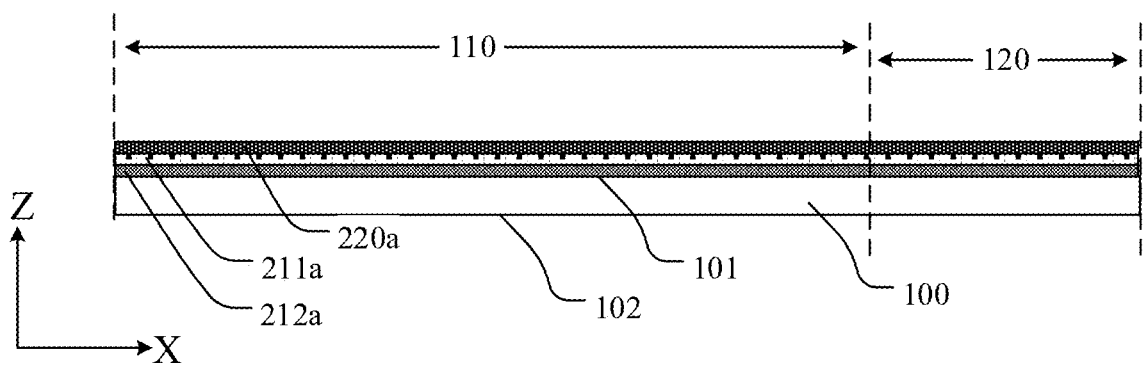
FIG. 7A to FIG. 7E are schematically views showing procedure steps of a fabrication method of an array substrate provided by an embodiment of the present disclosure.

As illustrated in FIG. 7A, a transparent base substrate 100 is provided, a metal material such as copper or molybdenum is deposited on the base substrate 100 to form a second thin film 212a; molybdenum oxide is deposited on the second thin film 212a to form a first thin film 211a, and a conductive material is deposited on the first thin film 211a to form a conductive thin film 220a. For example, a mode of depositing the second thin film 212a, the first thin film 211a and the conductive thin film 220a includes magnetron sputtering.

In at least one embodiment of the present disclosure, there are various ways to form a first thin film 211a, which will not be limited here.

For example, in at least one embodiment of the present disclosure, after a second thin film 212a is formed on a base substrate 100, a pre-fabricated molybdenum target is used, and an appropriate amount of oxygen is introduced during a magnetron sputtering process, so that molybdenum is oxidized to form molybdenum oxide, so as to form a first thin film 211a. For example, the preparation process may be performed in a physical vapor deposition (PVD) apparatus.

For example, in at least one embodiment of the present disclosure, after a second thin film 212a is formed on a base substrate 100, a pre-fabricated molybdenum oxide target is used, and a first thin film 211a is formed by magnetron sputtering. For example, the preparation process may be performed in a PVD apparatus. For example, in the PVD apparatus, the flow rate of Ar gas is 1,350 standard cubic centimeters per minute (sccm), the deposition pressure is from 0.5 pa to 1 pa, the power is from 11 kw to 13 kw, and the deposition rate is 82 nm/minute. For example, in the above-described PVD apparatus, a temperature may be controlled between 200° C. to 300° C. A degree of uniformity of the molybdenum oxide thin film (the second thin film 212a) prepared under the above-described conditions is high, and in a process of preparing the first thin film 211a by using the above-described method, it is not necessary to introduce oxygen into the PVD apparatus, which can avoid other structures in an array substrate from being oxidized, and is favorable for increasing a defect-free ratio of the array substrate.

For example, in at least one embodiment of the present disclosure, before the second thin film 212a is deposited, an insulating material thin film may be deposited on a base substrate 100 to form a buffer layer. The buffer layer is made of a transparent or translucent material. For example, the buffer layer may be made of an organic substance or an inorganic substance. For example, the buffer layer is made of an inorganic substance, for example, the inorganic substance is a metal oxide, in this way, the buffer layer and the second thin film 212a are tightly bonded to each other, which can prevent the second thin film 212a from being separated from the base substrate 100.

Figure 7B:
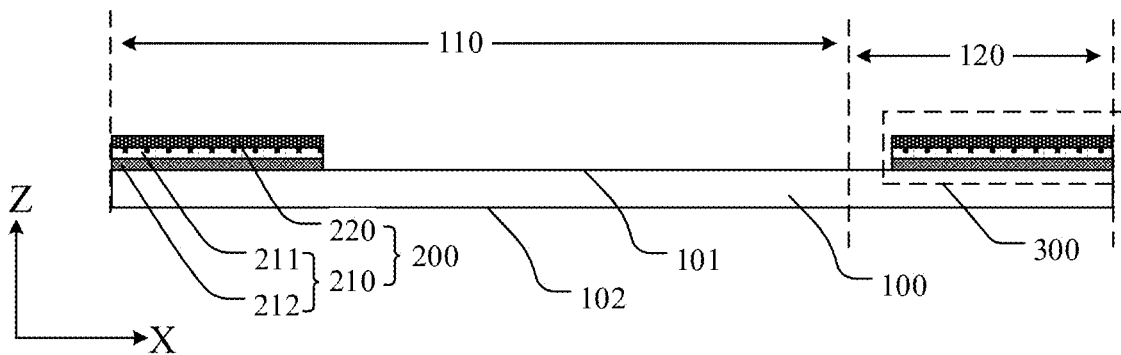

As illustrated in FIG. 7B, a patterning process is performed on a stacked layer including the second thin film 212a, the first thin film 211a and the conductive thin film 220a to form an electrode structure 200 including the first film layer 211, the second film layer 212 and the first electrode layer 220. The second thin film 212a is formed into the second film layer 212, the first thin film 211a is formed into the first film layer 211, and the conductive thin film 220a is formed into the first electrode layer 220. For example, the first electrode layer 220 in a display region 110 may be formed into a gate electrode, and the first electrode layer 220 in a non-display region 120 may be formed into a signal line 300. It should be noted that, the first electrode layer 220 in the display region 110 may also be formed into a signal line such as a common electrode line.

For example, in at least one embodiment of the present disclosure, a patterning process may be a photolithographic patterning process, which may include, for example: coating a photoresist layer on a structure layer to be patterned, exposing the photoresist layer with a mask, developing the exposed photoresist layer to obtain a photoresist pattern, etching the structure layer with the photoresist pattern, and then optionally removing the photoresist pattern.

It should be noted that, a second thin film 212a, a first thin film 211a and a conductive thin film 220a in the electrode structure 200 may be formed in different patterning processes, or may also form in a same patterning process as described above, thereby simplifying a preparation process of an array substrate.

For example, in at least one embodiment of the present disclosure, a first thin film 211a having molybdenum oxide may be doped with an anti-corrosive material such as tantalum (Ta), in order to control an etching rate in a patterning process, and is favorable for controlling a shape of an electrode structure formed, and increasing a defect-free ration of the formed electrode structure.

Figure 7C:
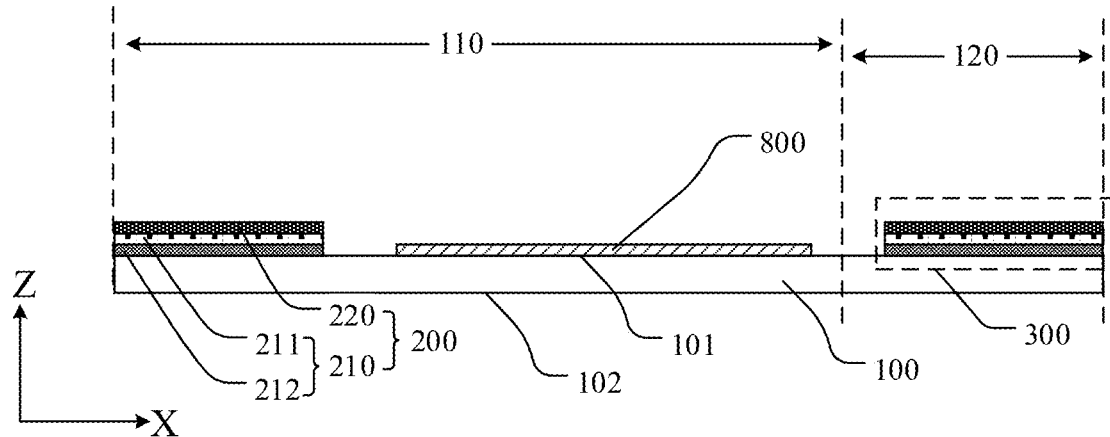

As illustrated in FIG. 7C, a transparent or translucent conductive material thin film is deposited on a base substrate 100, and a common electrode 800 is formed after a patterning process is performed on the conductive material thin film.

For example, the common electrode 800 may be formed with a mask by magnetron sputtering, without a patterning process, so as to simplify a preparation process of an array substrate.

Figure 8:
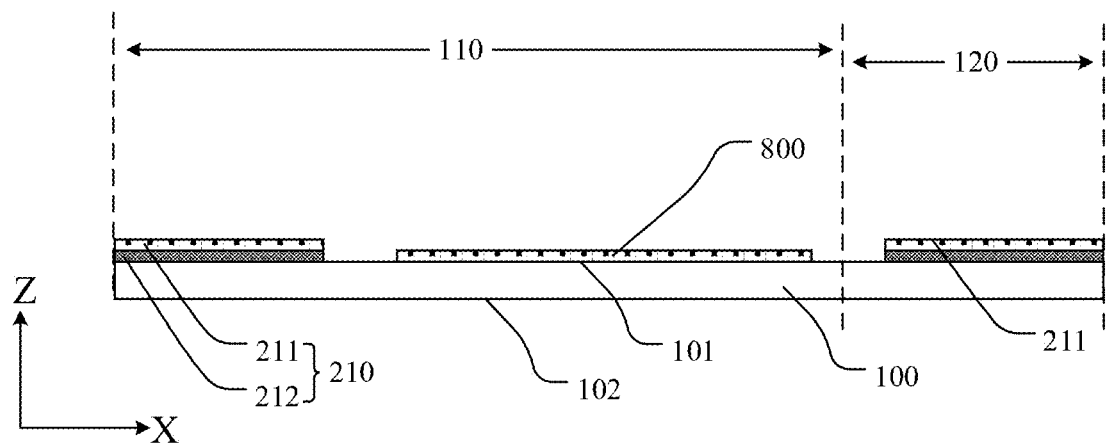
FIG. 8 is a structural schematic diagram of a step of fabricating a common electrode provided by another embodiment of the present disclosure.

For another example, a common electrode and a first film layer are made of a same material, in this way, the common electrode and the first film layer may be formed in a same patterning process. For example, as illustrated in FIG. 8, a transparent conductive material is formed on the base substrate 100 having the second film layer 212 formed thereon, and then a patterning process is performed on the transparent conductive material to simultaneously form the common electrode 800 and the first film layer 211.

Figure 7D:
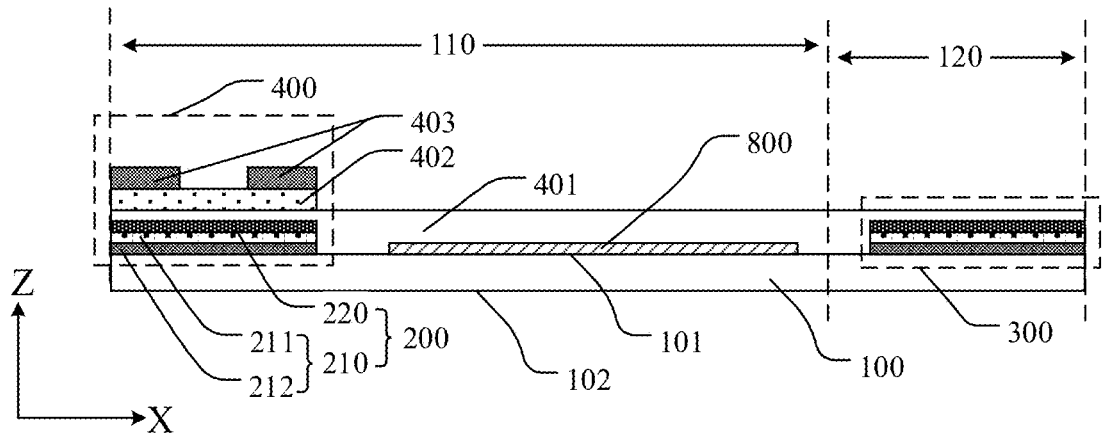

For example, as illustrated in FIG. 7D, a related fabrication process of a thin film transistor 400 is performed on the base substrate 100. For example, a gate insulating layer 401, an active layer 402 and a source-drain electrode layer 403 are sequentially formed on the electrode structure 200. For example, after the active layer 402 is formed, an interlayer dielectric layer may be deposited on the active layer 402, and then the source-drain electrode layer 403 is formed on the interlayer dielectric layer. For example, in a process of forming the source-drain electrode layer 403, a data line may be formed simultaneously. For example, the data line as well as a source electrode and a drain electrode in the source-drain electrode layer 403 may also be formed into the first electrode layer of the above-described electrode structure, that is, an anti-reflective layer is further formed on the data line and the source-drain electrode layer 403; the manufacturing method according to the foregoing embodiments may be referred to for the forming mode, and no details will be repeated here. In this way, the anti-reflective layer may reduce reflections of the data line, the source electrode and the drain electrode with respect to light incident from a second main surface of the base substrate onto the above-described structures. The gate insulating layer 401 is provided between the first electrode layer 220 and the active layer 402. The active layer 402 is provided on a side of the source-drain electrode layer 403 that is close to the first electrode layer.

Figure 7E:
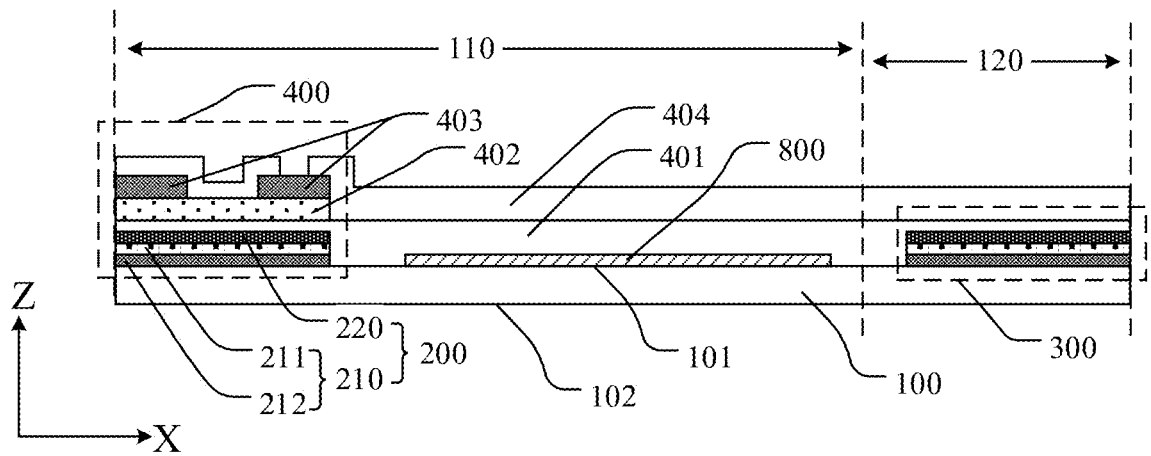

As illustrated in FIG. 7E, an insulating material thin film is deposited on the base substrate 100 having the thin film transistor 400 formed thereon to form a passivation layer 404. For example, in a process of forming the passivation layer 404, a thickness of the passivation layer 404 may be adjusted to planarize a surface of the array substrate. For example, the passivation layer 404 may be formed by a spin coating. In this way, in a subsequent preparation process of the array substrate, it is not necessary to further form a planarization layer, which simplifies a fabrication process of the array substrate, reduces costs, and reduces a design thickness of the array substrate.

As illustrated in FIG. 1, a via hole is formed in the passivation layer 404; then a conductive material thin film is deposited on the base substrate 100 having the passivation layer 404 formed thereon; a pixel electrode 700 is obtained after patterning the conductive material thin film; and the pixel electrode 700 is electrically connected with the drain electrode of the thin film transistor 400 through the via hole.

At least one embodiment of the present disclosure provides an array substrate, a manufacturing method thereof and a display panel, and may have at least one of beneficial effects below:

(1) In an array substrate provided by at least one embodiment of the present disclosure, an anti-reflective layer in an electrode structure reduces reflection of light coming from a second main surface of a base substrate, so that the electrode structure has reduced or no reflection of light, thereby reducing the array substrate's reflection of light, and increasing contrast of the array substrate and a contrast of a display image of a display panel comprising the array substrate, so as to increase a display effect.

(2) In a display panel provided by at least one embodiment of the present disclosure, an area for arranging a black matrix is reduced, thereby reducing consumption of the black matrix and reducing costs.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. An array substrate, comprising:
a transparent base substrate; and
an electrode structure, provided on the transparent base substrate, the electrode structure comprising:
a first electrode layer; and
an anti-reflective layer, the anti-reflective layer being located between the first electrode layer and the transparent base substrate,
wherein the anti-reflective layer comprises a first film layer and a second film layer stacked on each other; the first film layer is located between the first electrode layer and the second film layer; the first film layer and the second film layer differ in refractive index; and the first film layer is set such that light of a predetermined wavelength reflected at an interface between the first film layer and the second film layer and light reflected on a surface of the first electrode layer that faces the anti-reflective layer perform destructive interference.

2. The array substrate according to claim 1, wherein,
the anti-reflective layer comprises a plurality of anti-reflective film groups sequentially arranged on a side of the first electrode layer that faces the transparent base substrate,
each anti-reflective film group comprises a first film layer closer to the first electrode layer and a second film layer closer to the transparent base substrate; the first film layer and the second film layer differ in refractive index; and the first film layer is set such that light of a predetermined wavelength reflected at an interface between the first film layer and the second film layer and light reflected on a surface of the first electrode layer that faces the anti-reflective layer perform destructive interference.

3. An array substrate, comprising:
a transparent base substrate; and
an electrode structure, provided on the transparent base substrate, the electrode structure comprising:
a first electrode layer; and
an anti-reflective layer, the anti-reflective layer being located between the first electrode layer and the transparent base substrate,
wherein the anti-reflective layer comprises a first film layer and a second film layer stacked on each other; the first film layer is located between the first electrode layer and the second film layer; the second film layer is a partially transparent metal layer; the first film layer is a transparent layer; and the first film layer and the second film layer are set such that light of a predetermined wavelength reflected on a surface of the first electrode layer that faces the anti-reflective layer and light reflected on a surface of the partially transparent metal layer that is away from the first electrode layer perform destructive interference, and
light reflectivity of the first electrode layer is larger than light reflectivity of the second film layer.

4. The array substrate according to claim 3, wherein,
a material of the first film layer comprises molybdenum oxide; and
a material of the second film layer comprises at least one of molybdenum and a niobium molybdenum alloy.

5. The array substrate according to claim 4, further comprising:
a signal line;
a thin film transistor, comprising a gate electrode, a gate insulating layer, an active layer, a source electrode and a drain electrode, wherein the signal line and the gate electrode are set as the first electrode layer in the electrode structure, the active layer is provided on a side of the source electrode and the drain electrode that is close to the first electrode layer, and the gate insulating layer is provided between the first electrode layer and the active layer;
a pixel electrode, the pixel electrode being electrically connected with the drain electrode; and
a common electrode, the common electrode being located between the pixel electrode and the transparent base substrate, and a material of the common electrode being same as the material of the first film layer.

6. The array substrate according to claim 4, further comprising:
a signal line;
a thin film transistor, comprising a gate electrode, a gate insulating layer, an active layer, a source electrode and a drain electrode; the signal line and the gate electrode being set as the first electrode layer in the electrode structure, the active layer is provided on a side of the source electrode and the drain electrode that is close to the first electrode layer, and the gate insulating layer is provided between the first electrode layer and the active layer; and
an organic light emitting device, the organic light emitting device comprising a first driving electrode, an organic light-emitting functional layer and a second driving electrode; the organic light-emitting functional layer being located between the first driving electrode and the second driving electrode, the first driving electrode being electrically connected with the drain electrode.

7. The array substrate according to claim 1, wherein,
an orthographic projection of the first electrode layer on the transparent base substrate is located within an orthographic projection of the anti-reflective layer on the transparent base substrate; or an orthographic projection of the first electrode layer on the transparent base substrate coincides with an orthographic projection of the anti-reflective layer on the transparent base substrate.

8. A display panel, comprising the array substrate according to claim 1.

9. The display panel according to claim 8, further comprising:
a counter substrate, provided opposite to the array substrate, wherein a surface of the array substrate provided with the anti-reflective layer and the electrode structure faces the counter substrate; and
a black matrix, located on the counter substrate, wherein the black matrix is configured to shade at least a signal line on the array substrate, and the signal line is set as the first electrode layer in the electrode structure.

10. The display panel according to claim 8, further comprising:
a counter substrate, provided opposite to the array substrate, wherein a surface of the array substrate provided with the anti-reflective layer and the electrode structure faces the counter substrate; and
a black matrix, located on the array substrate and on a display side of a display panel, wherein the black matrix is configured to shade at least a portion of a signal line and at least a portion of a thin film transistor on the array substrate that does not comprised in the first electrode layer in the electrode structure.

11. A display device, comprising the display panel according to claim 9.

12. The display device according to claim 11, further comprising a backlight source and a flexible circuit board, the backlight source being located on a side of the counter substrate that is away from the array substrate, and an end of the flexible circuit board that is away from the array substrate is located on a side of the backlight source that is away from the array substrate.

13. A manufacturing method of an array substrate, comprising:

provlding a transparent base substrate;

forming an anti-reflective layer and a first electrode layer on the transparent base substrate to obtain an electrode structure, wherein the anti-reflective layer is formed between the first electrode layer and the transparent base substrate, wherein the forming the anti-reflective layer comprises:

forming a partially transparent metal material thin film on the base substrate as a second film layer, and forming a transparent material thin film on a side of the second film layer that is away from the transparent base substrate as a first film layer, wherein the first film layer and the second film layer are set such that light of a predetermined wavelength reflected on a surface of the first electrode layer that faces the anti-reflective layer and light reflected on a surface of the partially transparent metal layer that is away from the first electrode layer perform destructive interference, and wherein light reflectivity of the first electrode layer is larger than light reflectivity of the second film layer.

14. The manufacturing method according to claim 13, further comprising:

forming a common electrode on the transparent base substrate, wherein the common electrode and the first film layer are formed in a same patterning process.

* * * * *